United States Patent [19]
Lutz et al.

[11] Patent Number: 5,553,173
[45] Date of Patent: Sep. 3, 1996

[54] FARADAY-EFFECT SENSING COIL WITH STABLE BIREFRINGENCE AND METHOD OF MAKING SAME

[75] Inventors: Dale R. Lutz, Maplewood, Minn.; Trevor W. MacDougall, Cedar Park; William L. Taylor, Round Rock, both of Tex.; Wayne F. Varner, Woodbury, Minn.; Robert A. Wandmacher, Cedar Park, Tex.

[73] Assignee: Minnesota Mining and Manufacturing Company, St. Paul, Minn.

[21] Appl. No.: 393,413

[22] Filed: Feb. 23, 1995

Related U.S. Application Data

[62] Division of Ser. No. 205,899, Mar. 3, 1994, Pat. No. 5,463,312.

[51] Int. Cl.⁶ ............................ G02B 6/00; G01R 19/00; B65H 18/28
[52] U.S. Cl. .................. 382/12; 385/11; 324/96; 324/76.11; 250/227.17; 242/159
[58] Field of Search ............. 385/11, 12; 324/96, 324/76.11; 250/227.17; 242/159, 166, 174, 176, 178

[56] References Cited

U.S. PATENT DOCUMENTS

| | | | |
|---|---|---|---|
| 4,117,399 | 9/1978 | Ono et al. | 324/96 |
| 4,298,245 | 11/1981 | Aulich et al. | 385/12 X |
| 5,005,952 | 4/1991 | Clark et al. | 350/335 |
| 5,063,290 | 11/1991 | Kersey | 250/227.17 |
| 5,136,235 | 8/1992 | Brandle et al. | 324/96 |
| 5,434,501 | 7/1995 | Esman et al. | 324/96 |

FOREIGN PATENT DOCUMENTS

| | | | |
|---|---|---|---|
| 0044572 | 1/1982 | European Pat. Off. | G01R 15/07 |
| 57-198407 | 12/1982 | Japan | G02B 5/14 |
| PCT/GB87/00345 | 12/1987 | WIPO | G01R 15/07 |

OTHER PUBLICATIONS

Article entitled "Faraday Effect Sensors: The State of the Art" by G. W. Day and A. H. Rose, National Bureau of Standards, Boulder, CO 80303, SPIE vol. 985, Fiber Optic and Laser Sensors VI (1988) pp. 138–150.

*Primary Examiner*—Brian Healy
*Attorney, Agent, or Firm*—Gary L. Griswold; Walter N. Kirn; Jack V. Musgrove

[57] ABSTRACT

A fiber optic, Faraday-effect sensing coil has very low linear and circular birefringence, which remains stable over a wide range of temperatures. The coil is fabricated from a spun fiber having an effective linear beat length of 100 meters or more, and is annealed after being formed into the coil. The coil has improved discrimination for magnetic fields associated with electric current-carrying cables, and may be incorporated into an optical current transducer (OCT), either interferometric or polarimetric.

15 Claims, 2 Drawing Sheets

5,553,173

FARADAY-EFFECT SENSING COIL WITH STABLE BIREFRINGENCE AND METHOD OF MAKING SAME

This is a division of application No. 08/205,899 filed Mar. 3, 1994 now U.S. Pat. No. 5,463,312.

BACKGROUND OF THE INVENTION

1. Field of the Invention

The present invention generally relates to electric-current sensors, such as for power lines, and more particularly to optical fiber coils which, in response to the Faraday effect, sense with either interferometric or polarimetric techniques the magnetic field associated with an electric current.

2. Description of the Prior Art

Optical fibers which are sensitive to magnetic fields are known in the art, and are increasingly being used as optical current transducers (OCT's) for electric power utilities. A typical OCT uses a single-mode fiber formed into a coil surrounding the electrical conductor. The polarization of any light traversing the fiber will shift, in response to the change in any current flowing through the conductor, as a result of the magneto-optic "Faraday" effect. Further discussion of field-sensitive optical fibers is provided in U.S. Pat. No. 5,051,577 assigned to Minnesota Mining and Manufacturing Co. (3M—assignee of the present invention).

An optical medium becomes less suitable for use in a Faraday-effect sensor as its linear birefringence increases, which makes the coil more sensitive to external magnetic fields and distorts the polarized light signal. Care is particularly required in fiber selection since the formation of a coil from loops of a fiber introduces physical stresses which may further increase birefringence. Conventional techniques for minimizing linear birefringence have had limited success inasmuch as they have only reduced birefringent effects to a low level but not eliminated them completely. One method for reducing linear birefringence consists of twisting the fiber after it has been completely drawn from the preform ("twisted fiber"). Twisting effectively averages the fast and slow birefringent axes, yielding lower linear birefringence, but not completely eliminating it. Several authors even suggest maximizing circular birefringence so as to drown out linear birefringence (see U.S. Pat. Nos. 4,255,018 and 4,949,038, U.K. Patent Application No. 2,104,213, and Proc. SPIE 985 pp. 138–150), but this is actually a significant disadvantage since the circular birefringence can vary widely over time and affect the sensor's accuracy, requiring more frequent calibration. The circular birefringence is generally also temperature dependent, and a temperature change can thus result in a large shift in the orientation of the output polarization of the sensing coil.

A second method involves simultaneously spinning and drawing the fiber from the heated preform ("spun fiber"). A ratio of spin pitch to unspun-fiber beat-length can be selected which lowers the linear birefringence and also imparts an insensitivity to external stress. This approach usually, however, greatly increases the circular birefringence (as well as induced linear birefringence from coiling) which may be highly temperature dependent as shown in J. of Lightwave Tech. vol. 9, no. 8, pp. 1031–1037 (FIG. 11). Temperature sensitivity is also the subject of U.S. Pat. No. 4,563,639.

The third conventional method of reducing linear birefringence relies upon relieving or eliminating internal stresses present in the fiber coil. Such stresses may be produced by bending forces or transverse pressure applied to the fiber during manufacture, as well as from the stress induced when the coil is formed. Improvement in the performance of field-sensing optical fiber coils is consequently possible by annealing the coils at a temperature at which stress relaxation occurs. Linear and circular birefringence can be lowered, but not eliminated.

Optical fibers and coils of reduced linear birefringence, produced by any of the above methods, still exhibit undesirable characteristics. For example, it is not possible to remove linear birefringence due to geometric asymmetry by annealing a coil. Fibers which are spun while drawing, such as that described in U.K. Patent Application No. 2,101,762, exhibit induced linear birefringence after being coiled. Also, twisted fibers have a spin pitch which is limited by the fiber's fracture strength. It would, therefore, be desirable and advantageous to overcome these problems with a field-sensitive optical fiber coil wherein both linear and circular birefringence are negligible, and remain so over a wide range of temperatures, so as to produce a Faraday-effect sensor which operates with optimum sensitivity.

SUMMARY OF THE INVENTION

The present invention provides a Faraday-effect sensing coil and a method for making such a coil with improved ability to sense changes in the magnetic field associated with current-carrying electrical conductors, the coil comprising an optical fiber of radially symmetrical cross-section formed into one or more loops, having a circular birefringence of no more than 4°/m, and also having a linear birefringence of no more than 15°/m. The novel coil may be combined with conventional components to form an optical current transducer (OCT).

Optimum performance of the OCT is achieved by first selecting an optical fiber, of controlled cross-sectional geometry, which possesses very low levels of linear and circular birefringence. A fiber drawn, under controlled conditions, from a heated, spinning preform is suitable for this purpose. After coiling, it is heat treated to anneal out stresses which were introduced during the formation of the coil. Such heat treatment is more successful at eliminating linear birefringence if the fibers are already free of geometric asymmetry. The annealed coil of this invention thereafter possesses excellent properties for use as a sensing element in Faraday effect sensors. Unlike those disclosed in the prior art, sensors which use optical fiber coils of the current invention exhibit high levels of accuracy and stability such that electrical current sensitivity is unchanged over a wide range of temperature when subjected to strong adjacent magnetic fields. The effective linear beat length of the spun fiber is preferably greater than 100 meters.

BRIEF DESCRIPTION OF THE DRAWINGS

The invention will best be understood by reference to the accompanying drawings, wherein.

DESCRIPTION OF THE PREFERRED EMBODIMENT

Figure 1:
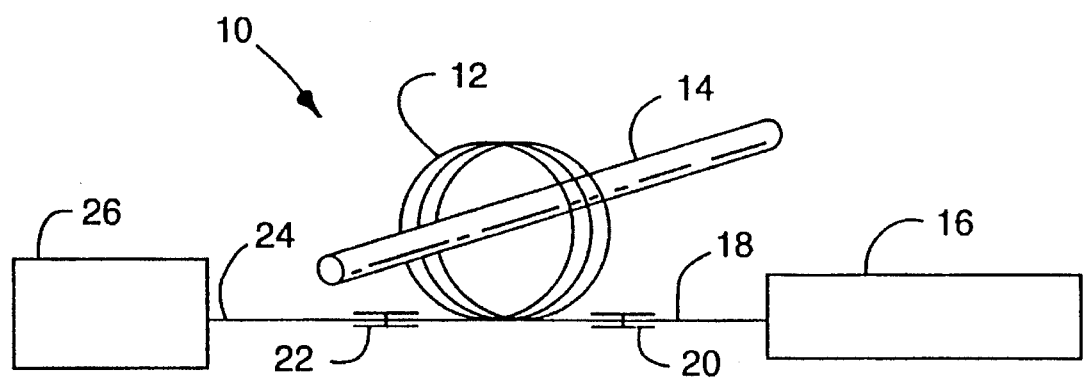
FIG. 1 is a diagrammatic view of an optical current transducer of the present invention using a novel Faraday-effect coil.

With reference to FIG. 1, the present invention is directed to an optical current transducer 10 which includes a novel Faraday-effect sensing coil 12. In operation, coil 12 encircles a current-carrying conductor 14, such as a power cable, to provide a means for sensing changes in the magnetic field associated with any electrical current flowing through cable 14. This is accomplished by examining the polarization of a light signal passing through coil 12. In the depicted embodiment, light from a conventional laser or other source 16 is fed into one end of a first polarizing optical fiber 18 the other end of which is attached via a splice 20 to the input end of the magnetic field-sensitive optical fiber coil 12. The exit end of coil 12 is attached via another splice 22 to a second polarizing optical fiber 24 through which the light passes to a conventional photodetector 26.

Each one of the splices 20 and 22 is preferably fused to avoid an air interface and to aid in maintaining optical alignment and mechanical stability. Before fusing the second splice 22, the polarization of light from the field sensitive coil 12 should be tested so that the polarization axis of the exiting light, when no current is flowing in cable 14, is at a desired angle with respect to the polarization axis of the second polarizing fiber 24, preferably about 45°. Thereafter, changes in the current in cable 14 will result in changes in the magnetic field permeated coil 12, and the characteristics of the field-sensitive optical fiber coil will cause corresponding changes in the angle of rotation of polarized laser light which enters second polarizing fiber 24 at splice 22, thereby affecting the amount of light reaching detector 26.

Figure 2:
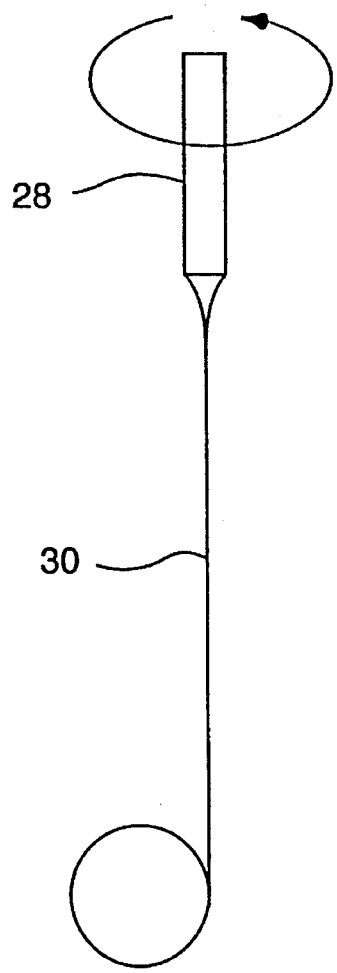
FIG. 2 is a schematic representation of the fiber forming process according to the present invention.

Referring now to FIG. 2, successful manufacture of an optical fiber coil of the invention requires careful selection of a preform 28 and control of the fiber forming process. A suitable preform may be produced using modified chemical vapor deposition (MCVD) techniques, and should be formed from a quartz tube having uniform wall thickness and good concentricity. The preferred fiber profile is a matched-clad (step index) single-mode fiber. Other possible profiles include depressed inner clad and "W" designs. Germanium is preferred over phosphorus and boron as a core dopant, as the latter tend to migrate (changing the core index profile) during annealing. A fluoro-phospho-silicate cladding composition has been found to be satisfactorily stable in the more lightly doped cladding region. A single acrylate coating is preferred to a silicone-acrylate dual coat, as the latter leaves a silica residue after annealing which can form a localized defect. It is also presently believed that the concentration of any dopants in the core should be kept at a minimum, and use of a slow collapse phase during preform manufacture will further aid in producing more concentric and radially symmetric fibers, thus minimizing their residual geometric birefringence. Techniques which require collapsing an outer tube onto the preform should be avoided.

During the process of drawing an optical fiber from preform 28, it is important to control the geometric symmetry of the cross-section of the fiber, as there is currently no way known to remove shape-induced linear birefringence using annealing techniques. Optimum geometric symmetry of the fiber core may be achieved by spinning the heated preform 28 as the optical fiber 30 is drawn from it. The spin pitch is preferably less than 0.04 times the unspun fiber beat length and most preferably less than 0.005 times the unspun fiber beat length. The invention advantageously uses a preform having an unspun fiber beat length of greater than about 0.5 meter. Depending upon the unspun fiber beat length, the fiber spin pitch may be as low as 2.5 mm., although a spin pitch of 2 cm. would also be exemplary, with a spin rate of 500 rpm and a draw speed of about 10 meters/minute. It is possible to determine the level of linear birefringence, caused by geometric asymmetry of the fiber core, by measuring the effective beat length of a selected fiber. High effective beat length is a good indicator that the shape-induced birefringence is very low. Typical beat lengths for prior art, unspun fibers range between ½ and 50 m. The effective linear beat length $L_{eff}$ of a spun fiber has been found to be:

$L_{eff}=(L_i*L_t)/[(4L_i^2+L_t^2)^{0.5}-2L_i]$, where $L_i$=unspun fiber intrinsic linear beat length in meters=$2\pi/\Delta\beta_i$, $L_t$=fiber spin pitch in meters=$2\pi/\xi$, $\Delta\beta_i$=unspun fiber intrinsic linear birefringence in radians/meter, and $\xi$=fiber twist rate in radians/meter.

Fibers used in the current invention preferably have $L_{eff}$ values of at least 100 m. Two fiber samples prepared in accordance with the present invention yielded effective linear beat lengths of greater than 120 m. Two exemplary fiber specifications which yielded good results are shown in the following table.

TABLE 1

| Fiber attribute | Fiber 1 | Fiber 2 |
| --- | --- | --- |
| Numer. aperture | 0.13 | 0.14 |
| Core diameter | 3.5 μm | 4.12 μm |
| Cladding diameter | 80 μm | 125 μm |
| Coating diameter | 150 μm | 250 μm |
| Attenuation | 3.7 dB/km | 2.5 dB/km |
| Cutoff | 690 nm | 740 nm |
| Retardance | | |
| prior to spin | 400°/m | 50°/m |
| after spin | 3.5°/m | <3°/m |
| Twist Rate/2π | 50 turns/m | 40 turns/m |

While high $L_{eff}$ (low linear birefringent) fibers are most useful for providing electrical current sensing coils of negligible sensitivity to random magnetic fields not associated with the primary signal generated by an electrical cable, it is still necessary to reduce stress-induced linear and circular birefringence to a minimum to stabilize the sensitivity of an optical fiber coil over an extended temperature range and time period. Advances provided by this invention have yielded optical fiber coil sensors which sustain a consistent level of sensitivity from −40° C. to 100° C.

Figure 3:
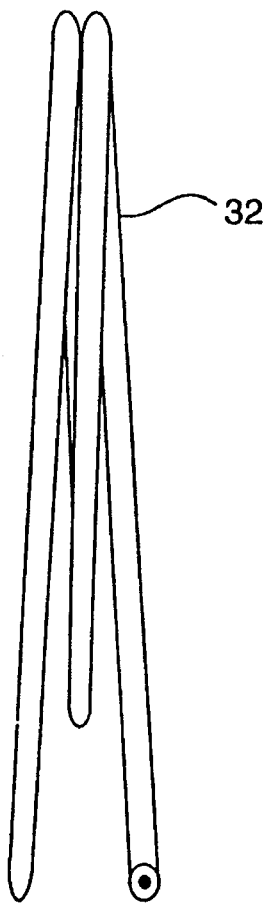
FIG. 3 is a side view of a tubular housing used to hold the fiber in a coil during annealing.

With further reference to FIG. 3, the stress-induced birefringence is minimized by annealing the fiber, after being formed into a coil, in accordance with the following method. Prior to annealing, any coating on the fiber should be removed by immersion in a suitable solvent, e.g., acetone, or by mechanically stripping the fiber. The cleaned fiber may then be annealed using conventional techniques; in the presently preferred embodiment, however, it is annealed with the use of a coiled tube or holder 32 formed of silica or quartz. Fiber 30 is threaded into holder 32 and holder 32 is then placed in the oven; it may be hung inside the oven or set on a suitable substrate, such as a silica plate. Details of holder 32, as well as information on other types of coil forms and holders, are disclosed in U.S. patent application Ser. No. 08/205,880, now U.S. Pat. No. 5,492,552, (filed concurrently with this application on or about Feb. 11, 1994), incorporated by reference. The annealing process is preferably carried out in an air-filled oven or kiln, with a temperature in the range of 550°–1250° C., most preferably 850°–1050° C. After placement of the coil holder in the oven, its temperature may be ramped up practically as fast as the oven can be heated; however, after a residence time of 5–24 hours, the rate at which the oven cools should be carefully controlled, particularly through the glass's transition temperatures, preferably less than 25° C. per hour reduction in temperature and, most preferably, about 18° C. per hour. This profile for coil cooling, after annealing, consistently produced sensor coils exhibiting desirable levels of linear and circular birefringence, as shown in Table 2, measured at room temperature.

TABLE 2

| Sensing | Birefringence (°/m) | |
|---|---|---|
| Coil | Circular (±1°/m) | Linear (±4°/m) |
| 50.3 | 1.5 | 10.8 |
| 50.4 | 1.0 | 8.0 |
| 50.7 | 1.0 | 12.9 |
| 50.11 | 0.5 | 7.2 |
| 52.5 | 0.0 | 5.5 |
| 52.6 | 0.5 | 12.9 |

These numbers should be compared with birefringence values in prior art fibers. Unannealed coils, even those made with spun fibers, typically have a circular birefringence in the range of 5°/m to 4200°/m, and a linear birefringence in the range of 45°/m to 600°/m. Moreover, the coils' birefringence is extremely stable over an extended range of temperatures, as shown in Table 3.

TABLE 3

| | Birefringence (°/m) | |
|---|---|---|
| Temperature °C. | Circular (±1°/m) | Linear (±4°/m) |
| −38.6 | 2.0 | 3.6 |
| −20.1 | 2.0 | 4.2 |
| 0.5 | 2.0 | 4.5 |
| 20.8 | 2.0 | 5.4 |
| 42.4 | 1.5 | 6.4 |
| 65.0 | 1.5 | 6.9 |
| 84.5 | 1.5 | 7.9 |

In a related study, fibers made in accordance with the current invention were formed into coils but were not subsequently annealed. The procedure involved the selection of a spun fiber which was first measured in a straight (uncoiled) configuration. As indicated in Table 4, the straight fiber exhibited very low levels of linear and circular birefringence. After winding the fiber into a 10.5 cm. diameter single coil configuration, as would be used in a sensor element, the birefringence measurements were again recorded. In this configuration a relatively low level of circular birefringence was maintained; however, stress induced linear birefringence increased dramatically to a level significantly higher than any coils which, after forming, were annealed according to the method of this invention. The increase in linear birefringence increases the error of Faraday effect sensing due to an increased sensitivity of unannealed coils to adjacent magnetic field effects.

TABLE 4

| Fiber Configuration | Linear Birefringence | Circular Birefringence |
|---|---|---|
| Straight | 4.6°/m | 1.0°/m |
| Coiled | 86.5°/m | 2.6°/m |

Those skilled in the art will accordingly appreciate that the annealing of a coil made from a spun fiber, as taught herein, may be used to provide an OCT having characteristics approaching the theoretical limits of sensitivity. The foregoing birefringence values are so low as to be negligible for most power cable sensing applications.

Figure 4:
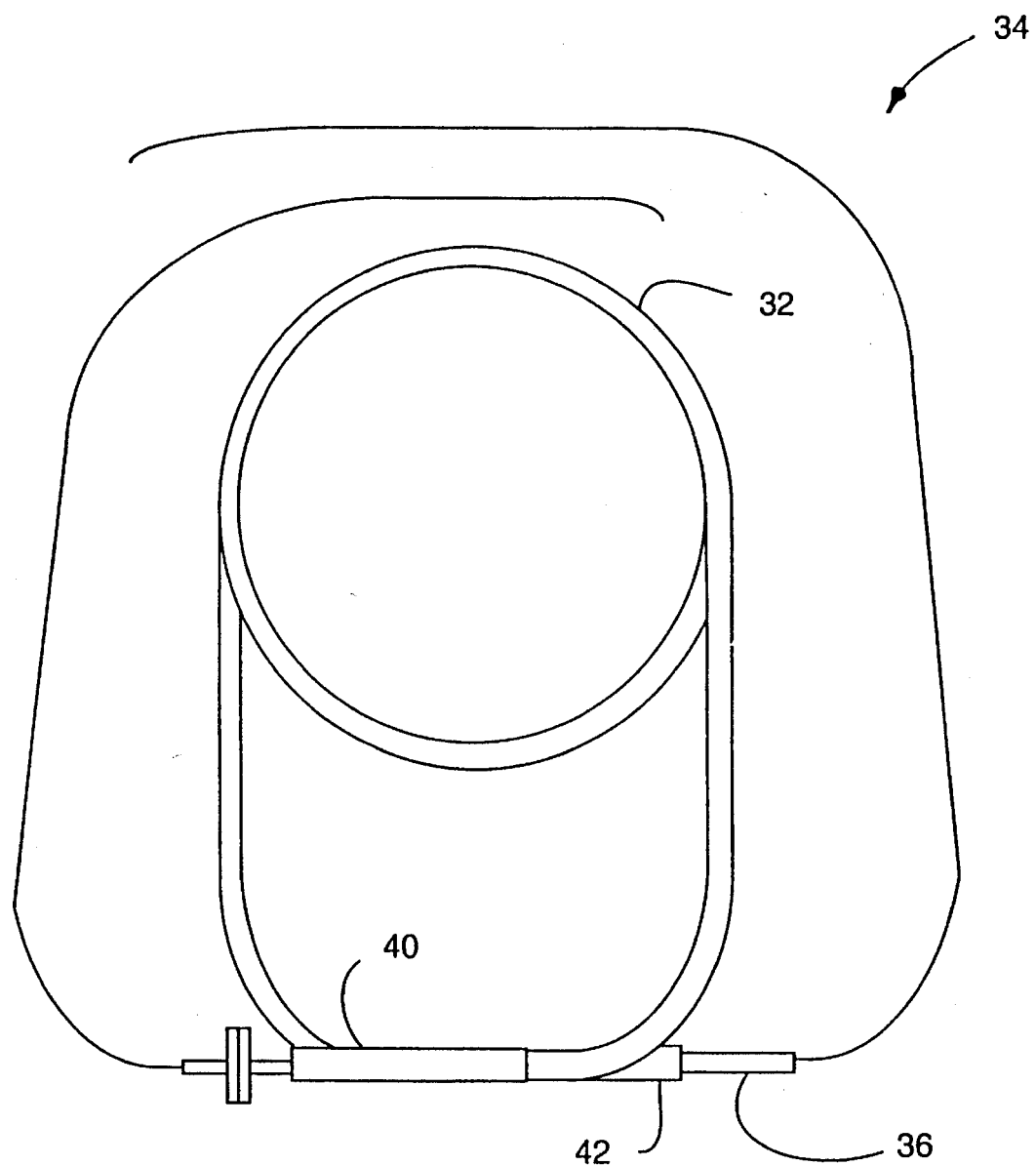
FIG. 4 is a front elevational view of the tubular housing of FIG. 3 and other components forming a coil subassembly for the optical current transducer of the present invention.

After the annealing step is complete, the sensing coil is ready for subsequent testing and fabrication into a subassembly for a Faraday-effect current sensor (either polarimetric or interferometric), such as the subassembly 34 shown in FIG. 4. In the depicted embodiment, subassembly 34 retains holder 32 in the subassembly package. The ends of the fiber coil are spliced (fusion) with the ends of the two polarizing fibers 18 and 24. Two tubes 36 and 38 (preferably quartz) are used to secure the polarizing fibers. Larger quartz tubes 40 and 42 may be used to hold tubes 36 and 38 in alignment with the ends of holder 32 and protect the splices.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. For example, the present invention could be combined with the teachings of U.S. Pat. No. 5,051,577 or other similar designs to provide a superior OCT. It is therefore contemplated that such modifications can be made without departing from the spirit or scope of the present invention as defined in the appended claims.

We claim:

1. An optical current transducer comprising:

an optical fiber being formed into a Faraday-effect sensing coil having linear birefringence and circular birefringence, each of said linear birefringence and said circular birefringence changing less than 20% over a temperature range of about 0° C. to about 20° C.;

light means connected to a first end of said fiber coil, for sending a light signal of known polarization; and detector means connected to a second end of said fiber coil, for sensing the polarization of said light signal after passing through said coil.

2. The optical current transducer of claim 1 wherein said optical fiber has a matched-clad fiber index profile.

3. The optical current transducer of claim 1 wherein said optical fiber has a core doped only with germanium.

4. The optical current transducer of claim 1 wherein said coil has an effective linear beat length of at least 100 meters.

5. The optical current transducer of claim 1 wherein:

said linear birefringence is less than about 15°/m, over said extended range of temperatures; and said circular birefringence is less than about 4°/m, over said extended range of temperatures.

6. The optical current transducer of claim 5 wherein said circular birefringence changes less than about 1°/m over said extended range of temperatures.

7. The optical current transducer of claim 5 wherein said linear birefringence changes less than about 5°/m over said extended range of temperatures.

8. A method of making a fiber optic, Faraday-effect sensing coil, comprising the steps of:

obtaining a spun optical fiber having a core of generally radially symmetrical cross-section;

forming a coil from said optical fiber;

annealing said coil at a temperature in the range between 550° C. to 1250° C.; and cooling said coil at a rate less than 25° C. per hour.

9. The method of claim 8 wherein said annealing step occurs at a temperature in the range between 850° C. to 1050° C.

10. The method of claim 8 wherein said cooling step occurs at a rate of about 18° C./hour.

11. The method of claim 8 wherein said obtaining step is achieved by:

selecting a quartz tube having uniform wall thickness;

preparing, by modified chemical vapor deposition, a matched-clad index profile preform from said quartz tube using only germanium as a core dopant; and heating and spinning said preform while simultaneously drawing said optical fiber therefrom.

12. The method of claim 11 further comprising the step of coating said fiber with a single layer of silicon-free acrylate.

13. The method of claim 11 wherein:

said preform has an unspun fiber beat length of at least 0.5 meter; and said preform is spun at a spin pitch which is less than 0.04 times said unspun fiber beat length.

14. The optical current transducer of claim 1 wherein each of said linear birefringence and said circular birefringence further change less than 20% over a temperature range of about −20° C. to about 65° C.

15. The optical current transducer of claim 1 wherein said fiber has a silicon-free, single acrylate coating.

* * * * *